United States Patent
Merrill

[19]

[11] Patent Number: 5,969,514
[45] Date of Patent: Oct. 19, 1999

[54] DIGITAL FEEDBACK POWER SUPPLY

[75] Inventor: Richard B. Merrill, Woodside, Calif.

[73] Assignee: National Semiconductor Corporation, Santa Clara, Calif.

[21] Appl. No.: 08/977,314

[22] Filed: Nov. 24, 1997

[51] Int. Cl.[6] .................................................... G05F 1/40
[52] U.S. Cl. ........................................ 323/283; 323/284
[58] Field of Search .................................... 323/282, 271, 323/272, 284, 283

[56] References Cited

U.S. PATENT DOCUMENTS

| | | | |
|---|---|---|---|
| 4,309,088 | 1/1982 | Uchida et al. | 354/21 |
| 4,935,740 | 6/1990 | Schouwenhaars et al. | 341/135 |
| 5,200,692 | 4/1993 | Krinsky et al. | 323/269 |
| 5,444,610 | 8/1995 | Gaudreau et al. | 323/298 |
| 5,481,178 | 1/1996 | Wilcox et al. | 323/287 |

*Primary Examiner*—Shawn Riley
*Attorney, Agent, or Firm*—Limbach & Limbach L.L.P.

[57] ABSTRACT

A digital feedback power supply circuit capable of adjusting the flow of power to a load includes a switching array having a plurality of switches. Each of the plurality of switches is individually controlled by a control circuit. A monitoring circuit measures the output voltage level at an output node and sends this measured output voltage to the control circuit as a feedback signal. The control circuit then compares the measured output voltage level with a reference voltage value. Based on this comparison, the control circuit determines how many of the switches contained in the switching array need to be active to satisfy the power drawn by the load. When the load requires more power, the control circuit sends control signals to turn ON a particular number of inactive switches to satisfy the power drawn by the load. In contrast, when the load requires less power, the control circuit sends control signals to turn OFF a particular number of active switches so that no more than the required power is delivered to the load.

17 Claims, 3 Drawing Sheets

DIGITAL FEEDBACK POWER SUPPLY

BACKGROUND OF THE INVENTION

1. Technical Field of the Invention

The present invention relates to the field of switching power supplies, and in particular, to a switching power supply with digital feedback.

2. Description of the Related Art

Low voltage integrated circuitry has been improving over the years. Currently, low voltage integrated circuits operating in the three volt range are highly desirable. Such low voltage operation provides, among other benefits, low power consumption. Thus, in battery operated devices, such as portable telephones and lap-top computers, low voltage integrated circuitry allows the devices to operate proportionally longer than devices requiring higher voltage for operation.

In low voltage, low power applications, the source voltage is typically very small. Thus, power supply circuits have been developed to amplify the source voltage for switching applications.

While the power supply circuit provides an increased voltage to circuits that require increased voltage, the supplied voltage level varies depending on load variations and battery supply variations. Thus, it is important to regulate the output voltage of the power supply circuit.

Voltage regulators provide a predetermined and constant output voltage to a load from an unregulated and fluctuating input voltage source. One type of regulator is a switching regulator.

FIG. 1 is a schematic block diagram of a prior art switching regulator circuit 100. The switching regulator circuit 100 operates from an unregulated supply voltage VIN coupled to terminal 111, and is used to provide a regulated DC output voltage VOUT at terminal 109 (e.g., 5 volts) for driving load 103 which, for example, may be a portable or laptop computer or other battery-operated system. The switching regulator circuit 100 employs a power switch 101, such as a power metal oxide semiconductor field effect transistor (MOSFET), coupled in series or parallel with the load 103, a control circuit 105, and an output circuit 113.

In such a switching regulator circuit 100, the power MOSFET 101, is operated as a saturated switch to alternately supply current to output circuit 113 which includes inductor 115 and output capacitor 117. Output circuit 113 smooths the alternating supply of current so that load 103 is provided a regulated voltage VOUT.

In particular, the current through the inductor 115 builds up during each clock pulse CLK from a clock circuit (not shown), storing energy in its magnetic field. This stored energy is then transferred to filter capacitor 117 at the output, which also smooths the output.

Control circuit 105 monitors the output voltage VOUT to provide a feedback voltage VFB proportional to the output voltage VOUT. The control circuit 105 operates by regulating the feedback voltage VFB to be substantially equal to a reference voltage VREF provided by a reference circuit (not shown). With feedback voltage VFB being regulated, the output voltage VOUT is in turn regulated to a higher voltage.

The control circuit 105 controls the turning ON and turning OFF of the power MOSFET switch 101 in order to regulate the flow of power to the load 103. In particular, the control circuit 105 provides an OFF pulse of constant duration (e.g., 2 to 10 microseconds) during which time power MOSFET switch 101 is held OFF and an ON pulse during which time power MOSFET switch 101 is held ON. Therefore, the control circuit 113 alternately turns power MOSFET switch 101 ON and OFF to provide an alternating supply of current to output circuit 113.

The duty cycle of power MOSFET switch 101, which controls the flow of power to the load 103, can be varied by a variety of methods. For example, the duty cycle can be varied by either (1) fixing the pulse stream frequency and varying the ON or OFF time of each pulse, or (2) fixing the ON or OFF time of each pulse and varying the pulse stream frequency. Thus, power in the switching regulator circuit 100 is transmitted across the power MOSFET switch 101 in discrete current pulses.

The switching regulator circuit 100 controls the output by changing the pulse width or switching frequency. Switching frequency refers to the rate or interval at which the power MOSFET 101 is switched on or off. For example, if a transistor is switched on and off continuously at a 1 millisecond interval, it is said to have a 1 kHz switching rate.

During each switching interval, power is consumed by the switching device as a result of slew rate of the voltage and the current supplied to the switching device. This consumed power is dissipated in the form of losses in the switching device. The total power losses of a switching device consist of switching loss and conduction loss. The magnitude of the switching loss is a function of the switch and the amount of current (I) conducted through the switching device. The magnitude of the conduction loss is a function of the amount of current (I) passing through the switching device.

Power generated by such losses is absorbed by the switching device in the form of thermal energy, or heat, which typically increases the temperature of the switching device, and in turn must be dissipated from the switching device to the environment by heat transfer methods, such as radiation, convection and conduction.

One disadvantage of circuit 100 in FIG. 1 is that the switching regulator circuit 100 has a constant ripple current in inductor 115 (for constant voltage output VOUT), but has a frequency which varies with VIN. The ripple oscillation frequency is given by the equation:

$$fRIP = (1/tOFF)/[1 - VOUT/VIN]$$

This ripple oscillation frequency may decrease to an audible level with low input voltages VIN. This could occur, for example, when a battery powering the switching regulator circuit 100 is nearly discharged. Inductor 115 may then generate and emit noise that can be objectionable to a user of the device employing the switching regulator circuit 100.

A second disadvantage of switching regulator circuit 100 is that the efficiency is generally a function of output current and typically decreases at low output current. Therefore, although when the switching regulator circuit 100 is supplying close to the rated output current (e.g., when a disk or hard drive is ON in a portable or laptop computer), the efficiency of the overall circuit can be high. However, at low output current there is a reduction in efficiency which is generally attributable to the losses associated with operating the switching regulator circuit 100. For example, during the time the power MOSFET switch 101 is OFF, the current through inductor 115 always ramps down by the same amount regardless of the output current of the switching regulator circuit 100. At low output currents this can cause the current in inductor 115 to reverse polarity and, thus, pull power from the load 103. During the following ON cycle, this current again ramps positive such that the average inductor current equals the load current. Losses associated with this constant ripple current, along with switching losses due to the charging and discharging of the gate of power MOSFET switch 101, quiescent current losses in the control circuitry of the switching regulator circuit 100, switch driver current losses and inductor/transformer winding and core losses, can produce large reductions in efficiency at low output currents. The reduction in efficiency of the switching regulator circuit 100 at low output current can become important in battery-operated systems where maximizing battery lifetime is desirable.

A third disadvantage of switching regulator circuit 100 is that it can be damaged under extreme operating conditions. In particular, the power switch 101 can be damaged. Such conditions occur primarily in the event of short-circuits at the output and when turning the switching regulator circuit 100 ON.

A fourth disadvantage of the conventional switching regulator circuit 100 is that power MOSFET switch 101 must be very large so that when the switch is open, the resistance is close to zero (no DC loss). For example, the power MOSFET switch 101 has a ratio of channel width to channel length (W/L) of 5000/0.5. Therefore, a large capacitance is associated with the gate of the power MOSFET switch 101, which consumes a lot of power when switching the power MOSFET switch 101 ON and OFF, even if only a small pulse of current is needed to maintain the output voltage.

A fifth disadvantage of switching regulator circuit 100 is that it reacts too slowly and is not able to handle rapid changes, such as transients. Thus, the large transients associated with the switching operation can cause crosstalk problems if the switching regulator circuit 100 is to be integrated with other analog or digital components in a system on a chip configuration.

A schematic of another conventional switching voltage regulator circuit 200, is illustrated in FIG. 2 and U.S. Pat. No. 5,481,178, which is incorporated herein by reference. This switching regulator circuit 200 includes a push-pull switch 201, a driver circuit 203, an output circuit 205, and a control circuit 207.

The push-pull switch 201 which includes two synchronously-switched power MOSFETs 211 (p-channel), and 213 (n-channel) stacked in series between the rail of voltage supply VIN and ground. Power MOSFETs 211 and 213 are used to alternately supply current to output circuit 205 which includes inductor 215 and output capacitor 217. In order to supply the alternating current, power MOSFETs 211 and 213 are respectively driven by P-channel driver 219 and N-channel driver 221.

The control circuit 207 allows push-pull switch 201 to go into a state of operation where both power MOSFETs 211, 213 are simultaneously OFF under conditions where the output voltage VOUT can be maintained substantially at a regulated voltage by output capacitor 217. The ability of push-pull switch 201 to go into such a "sleep mode" is in contrast to other conventional regulator circuits where one of the two power MOSFETs 211, 213 is substantially ON at all times.

When the output voltage falls below the regulated voltage in such a mode, control circuit 207 is adapted to briefly turn push-pull switch 201 on to recharge the output capacitor 217 back to a voltage level in excess of the regulated voltage.

Although the "sleep mode" feature of conventional switching circuit reduces the regulator circuit power consumption since push-pull switch 201 does not dissipate power or allow power to be pulled from load RL to ground in "sleep mode," this switching regulator circuit 200 has disadvantages. Similar to the other conventional switching regulator circuit 100, this switching regulator circuit 200 also requires a very large switch so that when the switch is open, the resistance is close to zero (no DC loss). Thus, a lot of power is still consumed driving the gate of the large switch when switching it on and off, even if only a small pulse of current is needed to maintain the output voltage. Also, this conventional switching regulator 200 still has large transients associated with the switching operation which can cause crosstalk problems.

Another conventional power supply is a switched capacitor power supply. As illustrated in FIG. 3, the switched capacitor power supply circuit 300 includes a charge pump 301, an output terminal 313, an output capacitor 315, a sensing circuit 305 and a control circuit 307. The components of the switched capacitor power supply circuit 300 operate to provide a regulated output voltage Vout at output terminal 313.

The charge pump 301 comprises a variable capacitor 303 and a plurality of switches SW1-SW4. The switches SW1-SW4, which are represented by N-channel FETs, turn ON at logic high level and are controlled by complementary and non-overlapping clock signals CLK 20 and CLK' (CLK bar) 20', which provide a triggering source.

The charge pump 301, supplied by a voltage supply VDD, operates in a two-stage switched mode to provide an amplified voltage at the output terminal 313. In a first phase of the operation of charge pump 301, the clock signal CLK' 20' is at a logic high level and the charge pump 301 is in a charging state, i.e., the variable capacitor 303 is being charged to voltage supply VDD through switches SW2 and SW3.

Then, in a second phase of the operation of charge pump 301, the switched capacitor voltage supply circuit 300 is switched such that the voltage supply VDD and variable capacitor 303 are connected in series so as to create an amplified voltage at the output terminal 313. Thus, when clock signal CLK 20 is at a logic high level, the charge pump 301 is in a discharging state, i.e., the variable capacitor 303 is providing energy to the output terminal 313 through switches SW1 and SW4.

The output capacitor 315 connects across output terminal 313 to a ground reference and provides energy to a load (not shown). Depending upon the energy requirements of the load, the output capacitor 315 may be slightly discharged or greatly discharged. To regulate the output to a selected voltage, the output capacitor 315 must be recharged during clock signal CLK 20. The energy needed to recharge the output capacitor 315 will be dependent upon the amount of energy it needs to supply. Thus, the control circuit 307 adjusts the capacitance of the variable capacitor 303 based on the energy needed.

In operation, the sensing circuit 305 senses an output voltage produced by the charge pump 301. When the voltage at the output terminal 313 is below a threshold, the sensing circuit 305 senses such, sends a signal to the control circuit 307, and the control circuit 307 increases the capacitance of the variable capacitor 303. As a result, additional charge is provided by the variable capacitor 303 and the voltage at the output terminal 313 increases. When the voltage at the output terminal 313 is above the threshold, the sensing circuit 305 senses such, sends a signal to the control circuit 307, and the control circuit 307 reduces the capacitance of the variable capacitor 303. As a further result, less charge is provided by the variable capacitor 303 and the voltage at the output terminal 313 decreases. Hence, by changing the capacitance of the variable capacitor 303, the output voltage is regulated to a relationship between the variable capacitor 303 and an output capacitor 315.

The switched capacitor power supply circuit 300 also has several disadvantages. Similar to the conventional switching regulator circuits 100, 200, the charge pump 301 requires power MOSFET switches SW1–SW4. Therefore, the switched capacitor power supply circuit 300 experiences similar power consumption problems.

In view of the foregoing, it would be desirable to provide a high efficiency switching power supply circuit. It would also be desirable to provide a control circuit and method for maintaining high efficiency over broad current ranges, including low output currents, in a switching power supply circuit.

SUMMARY OF INVENTION

An integrated feedback power supply circuit includes a switching array circuit having a plurality switches for providing an output power signal to an external circuit. A control circuit individually controls each of the plurality of switches to adjust the flow of power to the external circuit. An output circuit couples to the switching array circuit to receive an output signal from the switching array and generate the output power signal to an output node. A monitoring circuit couples to the output node to measure the output signal level and generate a measured output signal level as a feedback signal to the control circuit. The control circuit, which couples between the monitoring circuit and the switching array, receives the measured output signal level and compares it to a reference signal value. Based on this comparison, the control circuit determines how many of the switches need to be active to satisfy the power drawn by the external circuit. The control circuit then sends control signals to turn ON or OFF the appropriate number of switches. For example, when the measured output signal level transcends the reference signal value in a first direction, the external circuit requires less power. Therefore, the control circuit sends control signals to turn OFF some of the active switches. However, when the measured output signal level transcends the references signal value in a second direction, the external circuit requires more power. Therefore, the control circuit sends control signals to turn ON some of the inactive switches.

Since power is not wasted driving large capacitive gates of the switching transistors, the feedback power supply circuit operates more efficiently than conventional power supply circuits. Additionally, since only the number of switches that need to be active to satisfy the power drawn by the load are active, the power supply circuit of the present invention consumes less power.

In another embodiment of the present invention, the feedback power supply circuit is a digital feedback power supply circuit. This embodiment includes a logic control circuit, and an analog-to-digital (ADC) converter as the monitoring circuit. This embodiment provides the added advantages of more control of the power supply circuit, such as programming the number of switches that need to be active when a particular measured output signal value is received by the logic control circuit.

These and other features and advantages of the present invention will be understood upon consideration of the following detailed description of the invention and the accompanying drawings.

DETAILED DESCRIPTION OF THE PREFERRED EMBODIMENT

Figure 4:
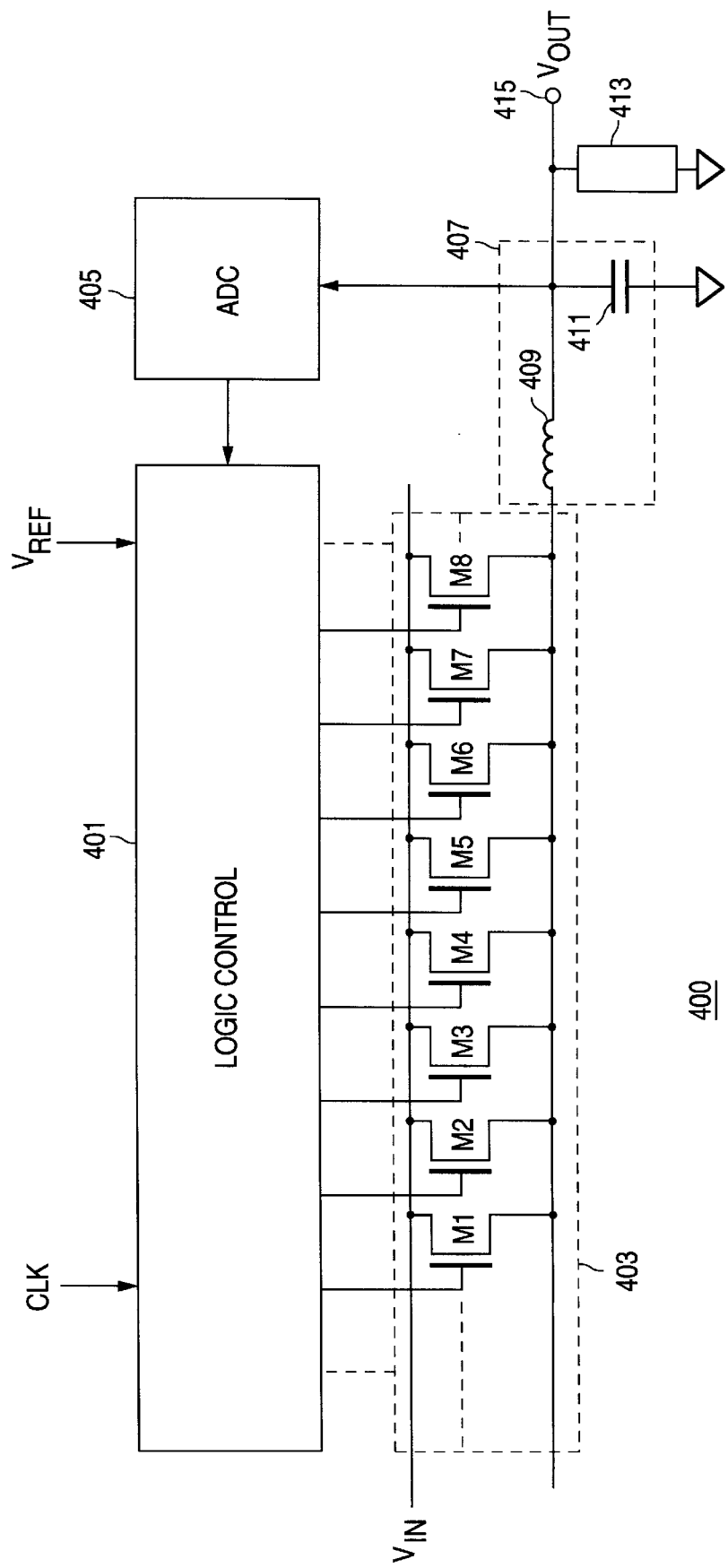
FIG. 4 illustrates a feedback power supply circuit in accordance with an embodiment of the present invention.

FIG. 4 is a schematic block diagram of a feedback power supply circuit 400 incorporating an embodiment of the feedback high efficiency control circuit of the present invention for driving a plurality of switches. Digital feedback power supply circuit 400 includes a logic control circuit 401, such as a microcontroller; a switching array 403; an analog-to-digital converter (ADC) 405; and an output circuit 407. A clock signal CLK provides timing for the logic control circuit 401. Although feedback power supply circuit 400 is implemented using a control circuit 401 with digital circuit technology, it should be understood that the same control circuit 401 may also be implemented utilizing analog circuit technology.

Switching array 403 includes a plurality of switches M1–M8 which supply power to the output circuit 407. While switches M1–M8 may be connected in a number of ways, an exemplary manner is illustrated in FIG. 4. Also, although as shown in FIG. 4, switches M1–M8 are implemented using MOS circuit technology, it should be understood that the same circuits may also be implemented utilizing bipolar circuit technology.

In the embodiment illustrated in FIG. 4, output circuit 407 includes an inductor 409 and an output capacitor 411, to smooth the alternating supply of current to provide a regulated voltage Vout to load 413. However, it will be appreciated that in an alternate embodiment, output circuit 407 includes only an output capacitor 411 to smooth the alternating supply of current.

Switching array 403 of the present invention functions similar to MOSFET power switch 101 of conventional switching regulator power supply 100, to control the flow of power to the load. However, although power is transmitted across switching array 403 in discrete current pulses similar to conventional switching regulator circuit 100, switching regulator circuit 100 and digital feedback power supply circuit 400 utilize different methods to control the flow of power to the load.

Control circuit 105 of conventional switching regulator power supply circuit 100 varies the frequency or duty cycle of power MOSFET switch 101 to adjust the flow of power to load 103. In contrast, digital feedback power supply circuit 400 adjusts the flow of power to load 413 by varying the sizes i.e., the width and length dimensions of the channels, of transistor switches M1–M8 that comprise switching array 403, and by individually controlling which of the switches M1–M8 turn ON and OFF to provide the desired power to load 413. Thus, switches M1–M8 have small sizes (W/L) which when combined, may be comparable to the size (W/L) of large power switch 101 of conventional switching regulator circuit 100.

Analog-to-digital convertor (ADC) 405 monitors the output voltage Vout level at output terminal 415, and provides a feedback signal to logic control circuit 401 based on this measured output voltage Vout level. Logic control circuit 401 compares the measured output voltage Vout received from ADC 405, with an internally stored reference voltage Vref. Based on the comparison, logic control circuit 401 determines how many of the plurality of transistor switches M1–M8 in switched array 403 need to be active to satisfy the power being drawn by load 413.

Logic control circuit 401 then generates control signals which individually control each of the plurality of switches M1–M8 in switching array 403. Thus, when the output voltage Vout can be maintained substantially at the regulated voltage, logic control circuit 401 generates control signals to turn OFF one or more of the switching transistors M1–M8. Otherwise, when the output voltage Vout needs to be increased to satisfy the power drawn by load 413, control circuit 401 generates control signals to turn ON one or more of the switching transistors M1–M8 to supply more power to load 413.

As a result, the output voltage Vout is dependent upon the number of switches M1–M8 in switching array 403 turning ON and OFF. By providing only the power needed with minimal loss, digital feedback power supply circuit 400 provides the most efficient operation and reduces costs.

In this way, in contrast to the conventional power supply circuits 100, 200, 300 which requires the same amount of power to switch the large MOSFET power transistor switches ON and OFF, digital feedback power supply circuit 400 of the present invention uses less power. By using a plurality of switches M1–M8, each having a smaller size, i.e., W/L ratio, than the large MOSFET power transistor switches of the conventional power supply circuits to adjust to the load current, the power consumption of switched array 403 is reduced under less than maximum conditions. Since only those switches necessary to supply power to the load are active, the circuit operates efficiently.

Operation of digital feedback power supply circuit 400 is explained as follows. For purposes of the explanation, load 413 is a microprocessor device since the power required for a microprocessor to operate is sporadic. When the microprocessor device is not performing processing, only minimal power is needed. The ADC 403 measures the output voltage Vout level at output terminal 415 and sends the measured output voltage Vout level to logic control circuit 401 as a feedback signal. Logic control circuit 401 compares the reference voltage VREF level with the measured output voltage Vout level.

When the magnitude of the feedback signal exceeds the reference voltage VREF, logic control circuit 401 determines only minimal power is required to satisfy the power drawn by the microprocessor and calculates how many of the switches M1–M8 need to be active to satisfy the minimal power drawn by the microprocessor. For purposes of this example, logic control circuit 401 determines that only three transistors need to be active to satisfy the power being drawn.

Each of the switches M1–M8 is independently controlled by logic control circuit 401. As shown in FIG. 4, each of the MOS transistors M1–M8 has a separate gate controlled by logic control circuit 401. Since switches M1–M8 are independently controlled, logic control circuit 401 can send control signals to turn ON switches M1–M3 in switching array 403, and to turn OFF switches M4–M8.

In contrast, when microprocessor device is performing processing, more power is needed. Therefore, the magnitude of the feedback signal from ADC 405 is less than the reference voltage VREF and logic control circuit 401 determines that more switches need to be turned on to satisfy the power being drawn by the microprocessor. For purposes of this example logic control circuit 401 determines that seven switches need to be turned on to satisfy the power being drawn. Thus, logic control circuit 401 sends control signals to switching array 403 to turn ON switches M4–M7 so that more power is supplied to the microprocessor.

According to the present invention, although a large switch is still required to transmit power to load 413, this large switch is divided into smaller switches M1–M8 for efficient operation. For example, power MOSFET switch 101 having a W/L ratio of 5000/0.5 can be divided in a binary way, such as, each switching transistor having a W/L ratio of 2000/1. Thus, based on the feedback signal from ADC 403, logic control circuit 401 would determine which transistors to switch to maintain a high voltage.

Figure 1:
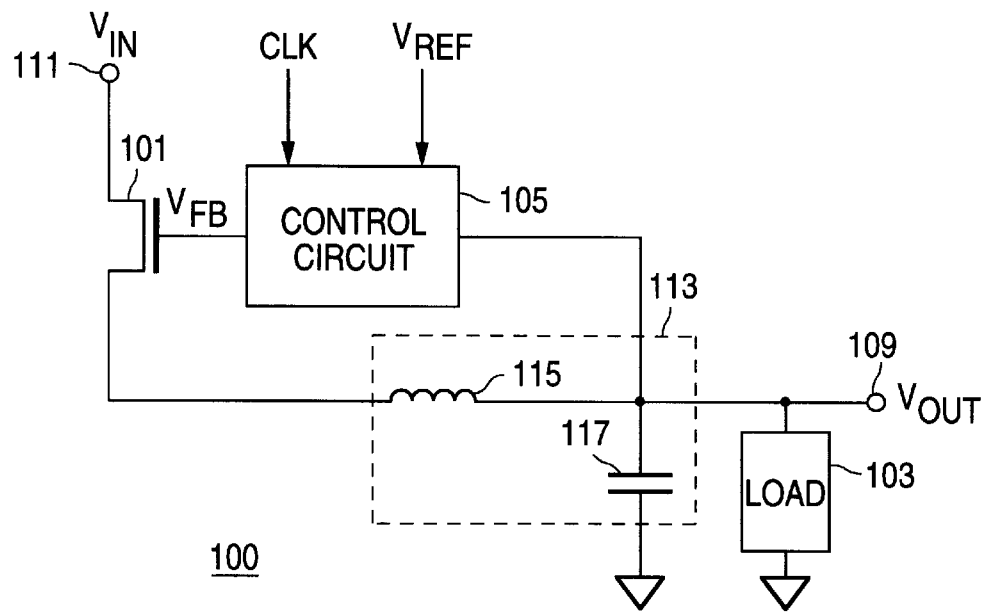
FIG. 1 illustrates a conventional switching regulator circuit.
Figure 2:
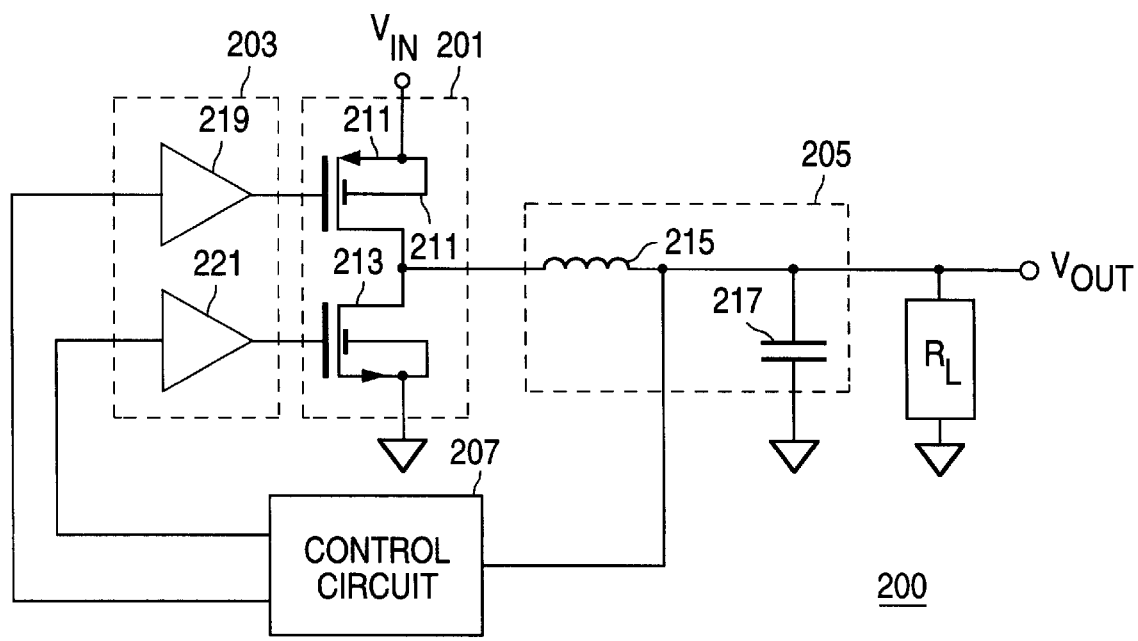
FIG. 2 illustrates another conventional switching regulator circuit.
Figure 3:
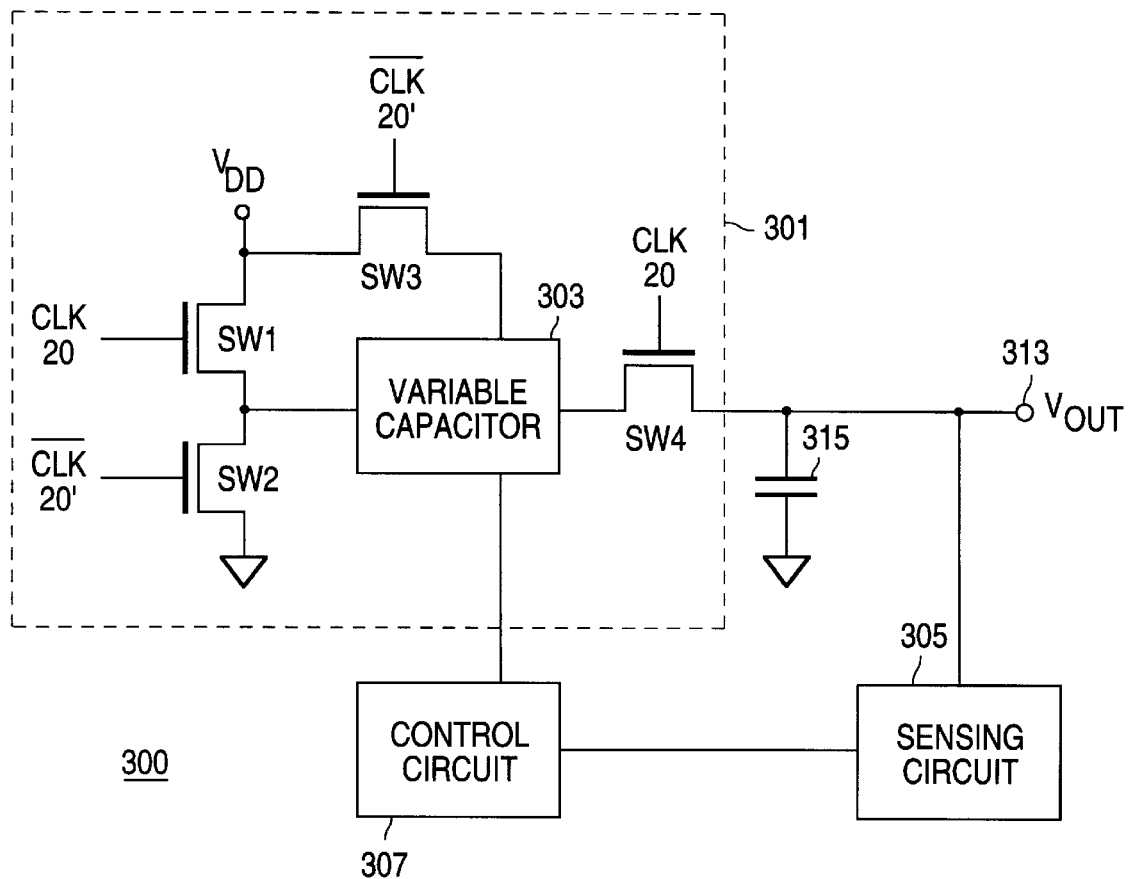
FIG. 3 illustrates a conventional switched capacitor regulator circuit.

Even considering the power consumed by the operation of logic control circuit 401 and ADC 405, overall, digital feedback power supply circuit 400 is still more efficient than the conventional circuit 100. A complementary metal oxide semiconductor (CMOS) ADC 405 operating in the MHz range with adequate resolution (e.g., 12 bits) for application in digital feedback power supply circuit 400, can be operated with a 50 $\mu$a power supply, and logic control circuit 401 has a similar power consumption. Thus, the total power consumption for digital feedback power supply circuit 400 is approximately 300 mW at 3 V voltage supply. This corresponds to less than ten percent loss of efficiency in a 6 Watt supply. This low loss of efficiency is much lower than the DC power loss for the analog support circuity in the conventional switching power supply circuits shown in FIGS. 1–3.

In addition to being a more efficient power supply circuit, the digital feedback power supply circuit 400 offers additional advantages by using digital signal processing (DSP) for the logic control circuit 401. First, using DSP allows for more intelligent feedback for controlling the digital feedback power supply circuit 400. For example, the number of switches that turn ON in response to a particular feedback signal can be programmed.

Second, digital signal processing can be used to program logic control circuit 401 to reduce the presence of ripple in the digital feedback power supply circuit 400. For example, when ripple is detected, logic control circuit 401 can be programmed to change the frequency of the switching regulator, to change the number of switches M1–M8 in the switching array turning on and off, or to change the frequency of the clock CLK to filter the 60 Hz noise. By programming logic control circuit 401 to sample at a high frequency, such as approximately 40 mHz, digital feedback power supply 400 can provide almost real time feedback without the use of inductor 409. Inductor 409 is typically one of the largest, heaviest and most expensive components of digital feedback power supply 400, thereby limiting its suitability for integration into digital feedback power supply 400. Thus, the elimination of inductor 409 facilitates the integration of the components of digital feedback power supply 400 and lowers the overall cost of the digital feedback power supply 400.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated digital feedback power supply circuit for providing a signal to an external circuit, the digital feedback power supply circuit comprising:

an output node configured to couple to an external circuit and convey an output power signal, wherein an amount of power the external circuit draws varies;

a switching array circuit comprising three or more switches, each of the three or more switches being individually controlled to provide a switching output signal;

an output circuit coupled to the switching array circuit and configured to receive the switching output signal and in accordance therewith generate the output power signal to the output node;

a monitoring circuit coupled to the output node and configured to monitor the output power signal from the output circuit and in accordance therewith generates a digital feedback signal; and a control circuit coupled between the monitoring circuit and the switching array circuit, wherein when the control circuit receives the digital feedback signal from the monitoring circuit, the control circuit compares a magnitude of the digital feedback signal to a reference signal value to determine a number of the three or more switches that need to be active to satisfy the amount of power drawn by the external circuit.

2. The apparatus of claim 1, wherein the number of the three or more switches that need to be active to satisfy the amount of power drawn by the external circuit may be successively arranged from a minimum voltage level, wherein none of the three or more switches are active, to a maximum voltage level wherein the three or more switches are active.

3. The apparatus of claim 2, wherein when the digital feedback signal changes, the control circuit adjusts the number of the three or more switches that are active.

4. The apparatus of claim 1, wherein the three or more switches comprise three or more transistors.

5. The apparatus of claim 1, wherein the output circuit comprises an inductor and a capacitor.

6. An apparatus including an integrated digital feedback power supply circuit for providing a power signal to an external circuit, the digital feedback power supply circuit comprising:

an output node configured to couple to an external circuit and convey an output power signal, wherein an amount of power the external circuit draws varies;

a switching array circuit comprising a plurality of switches wherein each of the plurality of switches is individually controlled to provide a switching output signal;

an output circuit coupled to the switching array circuit and configured to receive the switching output signal and in accordance therewith generate the output power signal to the output node;

an analog-to-digital circuit coupled to the output node and configured to monitor the output power signal from the output circuit and in accordance therewith generate a feedback signal; and a digital logic control circuit coupled between the monitoring circuit and the switching array, wherein when the digital logic control circuit receives the feedback signal from the monitoring circuit, the digital logic control circuit compares a magnitude of the feedback signal to a reference signal value to determine a number of the plurality of switches that need to be active to satisfy the amount of power drawn by the external circuit.

7. The apparatus of claim 6, wherein the plurality of switches comprises at least three switches.

8. The apparatus of claim 6, wherein the plurality of switches comprise a plurality of transistors.

9. The apparatus of claim 6, wherein the output circuit comprises an inductor and a capacitor.

10. The apparatus of claim 6, wherein the number of the plurality of switches that need to be active to satisfy the amount of power drawn by the external circuit may be successively arranged from a minimum voltage level, wherein none of the plurality of switches is active, to a maximum voltage level wherein the plurality of switches is active.

11. The apparatus of claim 10, wherein when the feedback signal changes, the logic control circuit adjusts the number of the plurality of switches that are active.

12. A method of controlling an integrated digital feedback power supply circuit to provide a power signal to an external circuit, the method comprising the steps of:

generating an output power signal;

receiving the output power signal by an output node and conveying the first output power signal to an external circuit, wherein an amount of power the external circuit draws varies;

monitoring the output power signal from the output node and in accordance therewith generating a digital feedback signal;

comparing a magnitude of the digital feedback signal with a reference signal value;

determining, based on the comparison of the magnitude of the digital feedback signal with the reference signal value, a number of three or more switches that need to be active to satisfy the amount of power drawn by the external circuit; and generating a plurality of control signals, wherein the control signals individually controls the plurality of switches, which activates the number of the three or more switches that need to be active to satisfy the amount of power drawn by the external circuit.

13. The method of claim 12, wherein when the number of the three or more switches that need to be active are activated, a remainder of the three or more switches is inactive.

14. The method of claim 12, wherein when the magnitude of the feedback signal exceeds the reference value, at least one of the three or more switches that is active, is deactivated.

15. The method of claim 12, wherein when the magnitude of the feedback signal is less than the reference value, at least one of the three or more switches that is inactive, is activated.

16. The method of claim 12, wherein the three or more switches comprise three or more transistors.

17. A method of controlling an integrated digital feedback power supply circuit to provide a power signal to an external circuit, the method comprising the steps of:

generating an output power signal;

receiving the output power signal by an output node and conveying the first output power signal to an external circuit, wherein an amount of power the external circuit draws varies;

monitoring the output power signal from the output node and in accordance therewith generating a feedback signal;

comparing a magnitude of the feedback signal with a reference signal value;

determining, based on the comparison between the magnitude of the feedback signal and the reference signal value, a number of a plurality of switching transistors that need to be turned on to satisfy the amount of power drawn by the external circuit; and generating a plurality of control signals to turn on or turn off at least one of the plurality of switching transistors, wherein when the magnitude of the feedback signal transcends the reference signal value in a first direction, at least one of the switching transistors that is active is deactivated to decrease the amount of power supplied to the external circuit, and when the magnitude of the feedback signal transcends the reference signal value in a second direction, at least one of the switching transistors that is inactive is activated to increase the amount of power supplied to the external circuit.

* * * * *